(12) United States Patent
Matsumoto et al.

(10) Patent No.: US 8,123,137 B2
(45) Date of Patent: Feb. 28, 2012

(54) SEMICONDUCTOR DEVICE

(75) Inventors: Chikako Matsumoto, Kanagawa (JP); Yasuyuki Takahashi, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 210 days.

(21) Appl. No.: 12/567,409

(22) Filed: Sep. 25, 2009

(65) Prior Publication Data
US 2010/0078484 A1    Apr. 1, 2010

(30) Foreign Application Priority Data

Sep. 29, 2008 (JP) ................................. 2008-251131

(51) Int. Cl.
*G06K 19/06* (2006.01)
(52) U.S. Cl. ........................................................ 235/492
(58) Field of Classification Search .................... 235/492
See application file for complete search history.

(56) References Cited

U.S. PATENT DOCUMENTS

| | | | |
|---|---|---|---|
| 4,827,111 A * | 5/1989 | Kondo ........................... | 235/380 |
| 4,962,485 A * | 10/1990 | Kato et al. ..................... | 365/229 |
| 5,072,103 A * | 12/1991 | Nara ............................. | 235/492 |
| 6,070,804 A | 6/2000 | Miyamoto | |
| 6,536,673 B1 * | 3/2003 | Kawasaki et al. ............. | 235/492 |
| 6,938,822 B2 | 9/2005 | Komatsu | |
| 7,000,835 B2 | 2/2006 | Komatsu | |
| 2006/0267771 A1 | 11/2006 | Shionoiri et al. | |
| 2008/0093461 A1 | 4/2008 | Marushima et al. | |
| 2008/0093935 A1 | 4/2008 | Saito et al. | |
| 2008/0150475 A1 | 6/2008 | Kato et al. | |
| 2009/0057418 A1 * | 3/2009 | Kozuma et al. ................ | 235/492 |

FOREIGN PATENT DOCUMENTS

| | | |
|---|---|---|
| EP | 1 752 914 A1 | 2/2007 |
| JP | 11-66248 | 3/1999 |
| JP | 2001-24152 | 1/2001 |
| JP | 2004-206408 | 7/2004 |
| JP | 2005-339466 | 12/2005 |
| JP | 2007-5778 | 1/2007 |
| JP | 2008-112440 | 5/2008 |
| JP | 2008-181494 | 8/2008 |
| WO | WO 2008/044559 A1 | 4/2008 |

OTHER PUBLICATIONS

International Search Report re application No. PCT/JP2009/065549, dated Oct. 13, 2009.
Written Opinion re application No. PCT/JP2009/065549, dated Oct. 13, 2009.

* cited by examiner

*Primary Examiner* — Jamara Franklin
(74) *Attorney, Agent, or Firm* — Husch Blackwell LLP

(57) ABSTRACT

To easily detect in a semiconductor device whether a voltage within the specifications of the semiconductor device is obtained. The semiconductor device includes a detecting circuit that detects an output voltage of an inner circuit of the semiconductor device and judges whether the output voltage is within or out of the specifications of the semiconductor device. A signal for determining whether an output voltage is within or out of the specifications is transmitted from the detecting circuit to a digital circuit, and the digital circuit performs or stops circuit operation in accordance with the signal.

24 Claims, 11 Drawing Sheets

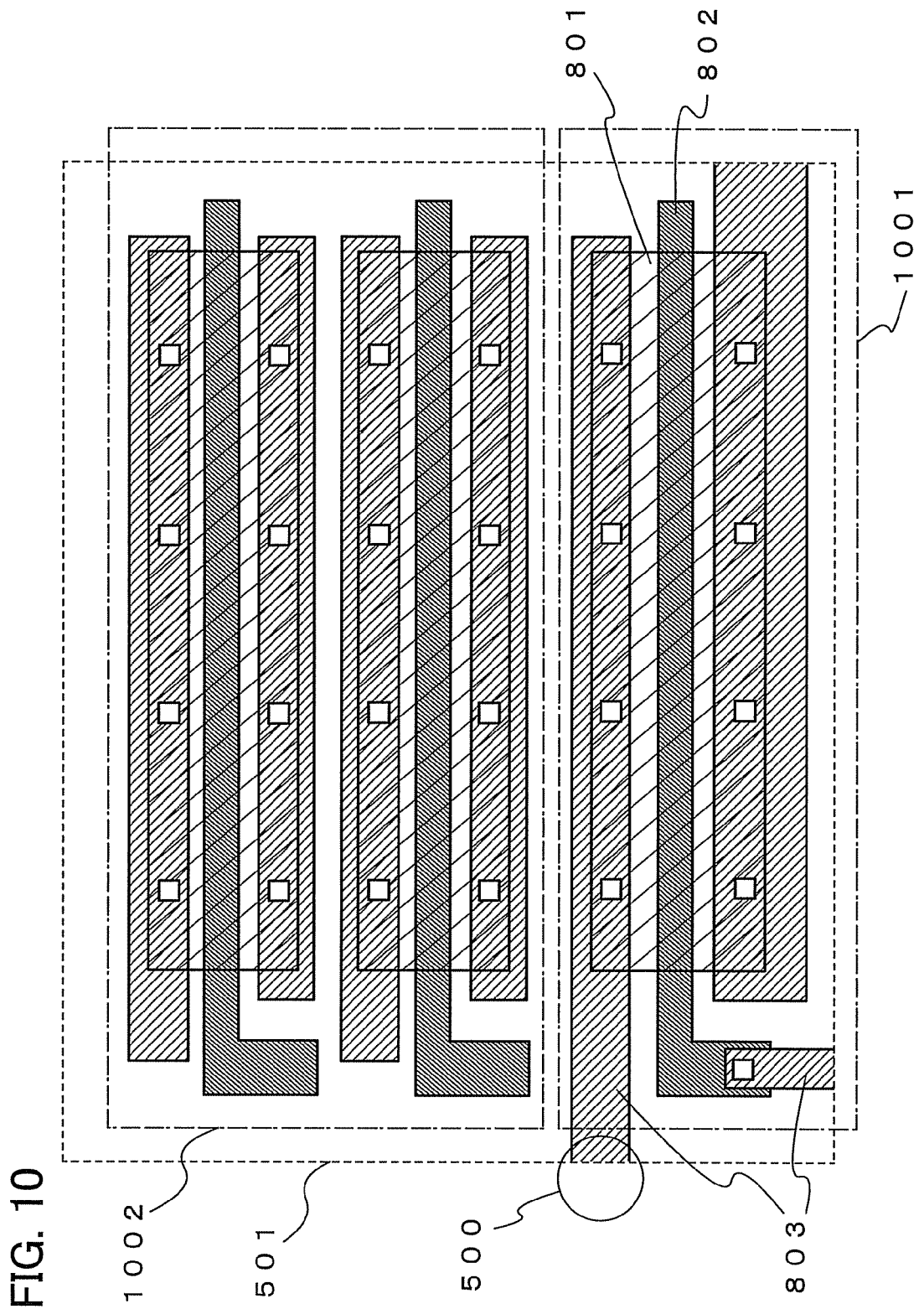

1100

1101

1102

1103

1104

1105

1106

SEMICONDUCTOR DEVICE

TECHNICAL FIELD

The technical field relates to a semiconductor device and a method for driving the same. In particular, the technical field relates to a semiconductor device that is capable of transmitting and receiving information in a non-contact manner through wireless communication.

BACKGROUND ART

In recent years, individual identification technologies have attracted attention, in which individual identification information (ID) is assigned to each object to recognize information on the object, such as a history thereof. In particular, semiconductor devices that are capable of transmitting and receiving data in a non-contact manner through wireless communication using radio waves have been developed. Such semiconductor devices are referred to as RFID tags (also referred to as wireless tags, IC tags, IC chips, wireless chips, non-contact signal processing devices, or semiconductor integrated circuit chips), and have been brought into the market to be used for management of product, and the like (for example, see Patent Document 1).
Reference
[Patent Document 1] Japanese Published Patent Application No. 2007-5778

DISCLOSURE OF INVENTION

The conventional semiconductor device disclosed in Patent Document 1 has the following problem. In the case where a defective portion exists in a circuit and a voltage within the specifications of the semiconductor device (hereinafter, also referred to as a specified voltage) cannot be obtained, the defective portion is detected with a probe or the like, which requires a lot of time and effort.

Furthermore, in the case where communication is performed with a long distance between a reader/writer and a semiconductor device, the problem that the semiconductor device does not operate normally occurs because a weak signal is transmitted and a specified voltage cannot be obtained.

In view of the foregoing problems, it is an object of the present invention to easily detect in a semiconductor device whether a voltage within the specifications of the semiconductor device is obtained.

One embodiment of a semiconductor device includes a detecting circuit that detects an output voltage of an inner circuit and judges whether the output voltage is within or out of the specifications of the semiconductor device.

A signal for determining whether an output voltage is within or out of the specifications (hereinafter, also referred to as a determination signal) is transmitted from the detecting circuit to a digital circuit, and the digital circuit controls circuit operation in accordance with the signal.

Another embodiment of a semiconductor device includes a detecting circuit that detects a voltage and outputs a determination signal. The detecting circuit includes an input portion to which the voltage is input, a wiring to which a reference voltage is input, a diode portion having a plurality of diodes serially connected between the input portion and the wiring, and an output portion from which the determination signal is output. The number of the diodes is variable.

Another embodiment of a semiconductor device includes a detecting circuit that detects a voltage and outputs a determination signal, and a digital circuit for controlling operation of a memory circuit in accordance with the determination signal. The detecting circuit includes an input portion to which the voltage is input, a wiring to which a reference voltage is input, a diode portion having a plurality of diodes serially connected between the input portion and the wiring, and an output portion from which the determination signal is output. The detecting range of the detecting circuit is controlled by the number of the plurality of diodes, and the number of the diodes is variable.

Another embodiment of a semiconductor device includes a detecting circuit that detects a voltage and outputs a determination signal. The detecting circuit includes an input portion to which the voltage is input, a wiring to which a reference voltage is input, a transistor, a first resistor and a second resistor, a diode portion having a plurality of diodes serially connected, a buffer circuit, and an output portion from which the determination signal is output. The input portion is electrically connected to one terminal of the first resistor and a source of the transistor. The other terminal of the first resistor is electrically connected to a gate of the transistor and an anode of the diode portion. A cathode of the diode portion is electrically connected to the wiring and one terminal of the second resistor. A drain of the transistor and the other terminal of the second resistor are electrically connected to the output portion via the buffer circuit. The number of the diodes is variable.

Another embodiment of a semiconductor device includes a detecting circuit that detects a voltage and outputs a determination signal, and a digital circuit for controlling operation of a memory circuit in accordance with the determination signal. The detecting circuit includes an input portion to which the voltage is input, a wiring to which a reference voltage is input, a transistor, a diode portion having a plurality of diodes serially connected, a first resistor and a second resistor, a buffer circuit, and an output portion from which the determination signal is output. The input portion is electrically connected to one terminal of the first resistor and a source of the transistor. The other terminal of the first resistor is electrically connected to a gate of the transistor and an anode of the diode portion. A cathode of the diode portion is electrically connected to the wiring and one terminal of the second resistor. A drain of the transistor and the other terminal of the second resistor are electrically connected to the output portion via the buffer circuit. The detecting range of the detecting circuit is controlled by the number of the plurality of diodes, and the number of the diodes is variable.

Another embodiment of a semiconductor device includes a detecting circuit that detects a voltage and outputs a determination signal, and a digital circuit for controlling operation of a memory circuit in accordance with the determination signal. The detecting circuit includes an input portion to which the voltage is input, a wiring to which a reference voltage is input, a transistor portion having a plurality of transistors connected in parallel, a diode portion having a plurality of diodes serially connected, a first resistor and a second resistor, a buffer circuit, and an output portion from which the determination signal is output. The input portion is electrically connected to one terminal of the first resistor and a source of the transistor portion. The other terminal of the first resistor is electrically connected to a gate of the transistor portion and an anode of the diode portion. A cathode of the diode portion is electrically connected to the wiring and one terminal of the second resistor. A drain of the transistor portion and the other terminal of the second resistor are electrically connected to the output portion via the buffer circuit. The detecting range of the detecting circuit is controlled by the number of the plurality of transistors and the number of the plurality of diodes, and the number of the transistors and the number of the diodes are variable.

The diode portion may include a connection portion in which an anode of one or more of the plurality of diodes is electrically connected to the wiring to which a reference voltage is input. The number of diodes serially connected can be increased by electrically disconnecting the connection portion. On the other hand, the number of diodes serially connected can be decreased by electrically connecting an anode of one or more of the plurality of diodes to the wiring to which a reference voltage is input. That is, in the diode portion, the number of diodes serially connected is variable. Also in the transistor portion, the number of transistors is variable if a structure similar to that of the diode portion is employed.

In the semiconductor device, the voltage is a signal voltage or a power supply voltage. The signal voltage is generated by a rectifier circuit and the power supply voltage is generated by a constant voltage circuit.

In this specification, a voltage for judging whether an output voltage is within or out of the specifications of the semiconductor device is also referred to as a judgment voltage. The range detected by the detecting circuit is determined by the judgment voltage.

EFFECT OF THE INVENTION

The incorporation of a detecting circuit into a semiconductor device results in improvement of reliability, reduction in power consumption, simplified estimation of yield, reduction in cost, and the like.

BRIEF DESCRIPTION OF DRAWINGS

In the accompanying drawings:
FIG. 10 is a diagram illustrating a semiconductor device.

BEST MODE FOR CARRYING OUT THE INVENTION

Figure 1:
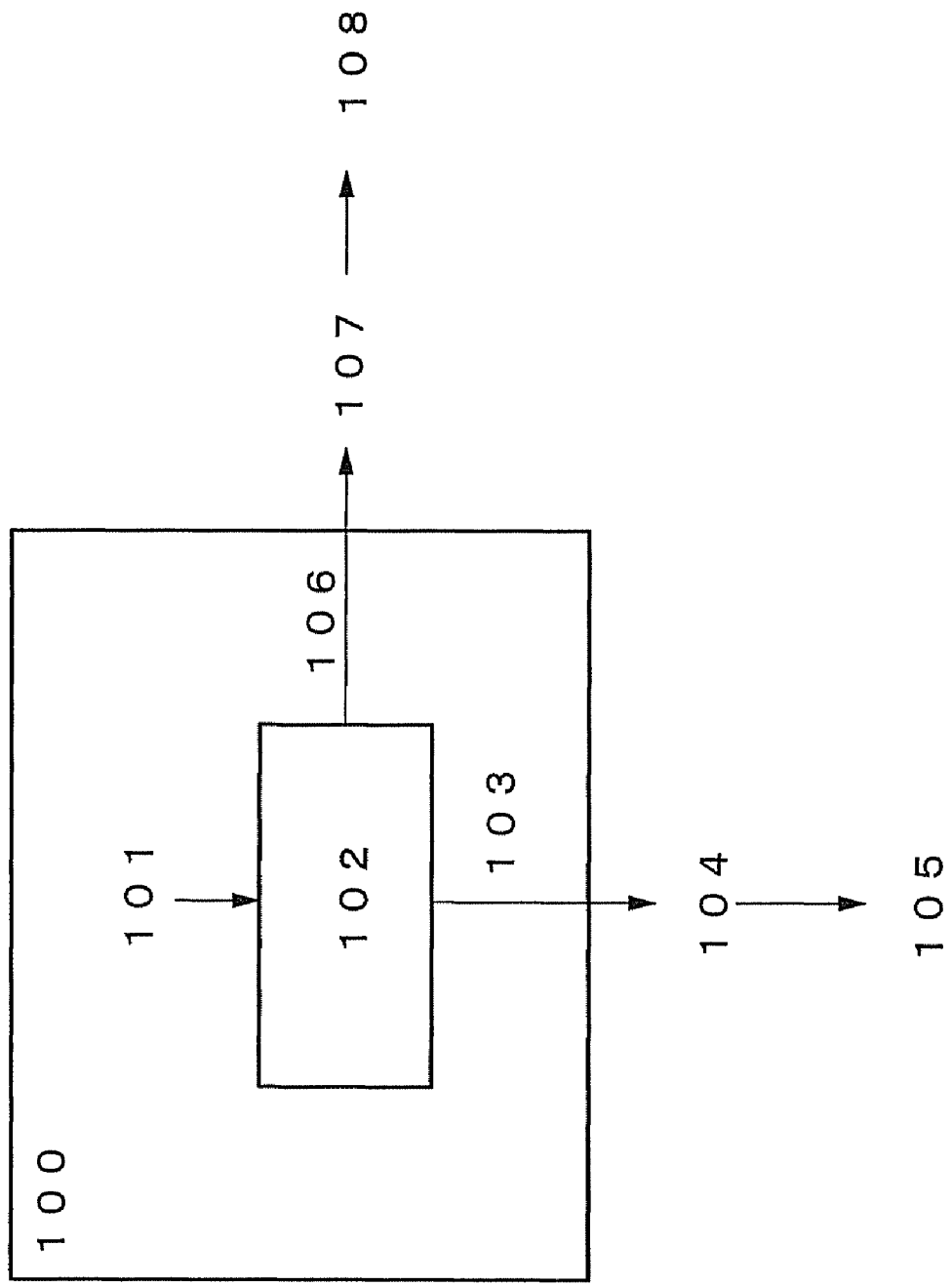
FIG. 1 a diagram illustrating a conception of a semiconductor device.

Embodiments of the present invention will be described in detail with reference to drawings.

Note that it is apparent to those skilled in the art that the present invention is not limited to the description below, and modes and details can be modified in various ways without departing from the spirit and scope of the present invention. Accordingly, the present invention should not be construed as being limited to the description of the embodiments given below.

Note that in the structures of the present invention described below, like portions or portions having a similar function are denoted by like reference numerals, and the description thereof is omitted.

Embodiment 1

In this embodiment, an example of a configuration of a semiconductor device having a function of detecting whether an output voltage is within or out of the specifications of the semiconductor device will be described with reference to FIG. 1 and FIG. 2.

First, a semiconductor device is briefly described with reference to FIG. 2. In FIG. 2, a semiconductor device 200 is an RFID tag performing wireless communication, and includes an antenna circuit 201, an analog circuit 100, a digital circuit 202, and a memory circuit 203.

The antenna circuit 201 receives radio waves from a reader/writer 210. The analog circuit 100 generates a power supply voltage and a signal voltage from the signal received by the antenna circuit 201, and then outputs the voltages. The digital circuit 202 includes a selection circuit (a switch circuit) to control the other circuit portions. Then, data is written to/read from the memory circuit 203 in accordance with the signal from the digital circuit 202. The writing of data to the memory circuit 203 may be performed after the signal voltage is stepped up by a step-up circuit.

At that time, the semiconductor device 200 operates normally if an output voltage within the specifications of the semiconductor device 200 (a voltage within a predetermined range) is obtained from the analog circuit 100.

However, an output voltage out of the specifications of the semiconductor device 200 (a voltage out of the predetermined range) is obtained in some cases, such as when communication is performed with a long distance between the reader/writer 210 and the semiconductor device 200, or when a defective portion exists in the semiconductor device 200. In such a case, it is difficult that the semiconductor device 200 operates normally.

Thus, in this embodiment, the analog circuit 100 has a function of judging whether an output voltage of the analog circuit 100 is within or out of the specifications of the semiconductor device 200, so that an output voltage within the specifications can be obtained and the semiconductor device 200 can operate normally. Such a configuration of the analog circuit 100 will be described below.

FIG. 1 is a diagram showing the conception of a function of detecting an output voltage in the analog circuit 100. In FIG. 1, a detecting circuit 102 is provided in the analog circuit 100 and has a function of detecting an output voltage 101 of the analog circuit 100.

First, the output voltage 101 is input to the detecting circuit 102. The detecting circuit 102 detects the output voltage 101 and judges whether the output voltage 101 is within or out of the specifications of the semiconductor device 200.

In the case where the output voltage 101 is a voltage within a predetermined range, the output voltage 101 is judged as being within the specifications (a step 103). Then, a determination signal HIGH (1) is output from the detecting circuit 102 (a step 104) to operate the semiconductor device 200 (a step 105).

On the other hand, in the case where the output voltage 101 is a voltage out of the predetermined range, the output voltage 101 is judged as being out of the specifications (a step 106). Then, a determination signal LOW (0) is output from the detecting circuit 102 (a step 107) to stop the operation of the semiconductor device 200 (a step 108). In addition to stopping the operation of the semiconductor device 200, an error code may be output.

Note that the configuration of the detecting circuit 102 may be changed so that a signal LOW (0) is output when the output voltage is within the specifications and a signal HIGH (1) is output when the output voltage is out of the specifications.

In the semiconductor device of this embodiment, the analog circuit has the function of detecting an output voltage, whereby the semiconductor device can operate normally.

In addition, it is possible to prevent malfunction of the semiconductor device due to a weakened signal or failure, resulting in improvement of reliability and reduction in power consumption.

The semiconductor device 200 is not limited to the aforementioned configuration, and may include a central processing unit (hereinafter, referred to as a CPU), a sensor element, an interface circuit, or the like.

The semiconductor device 200 is broadly classified into an active type which incorporates a power supply (a power storage portion) and a passive type which operates by utilizing power of radio waves (or electromagnetic waves) from the outside. Furthermore, there is also a semiconductor device referred to as of a semi-active type which charges a power supply (a power storage portion) by utilizing power of radio waves (or electromagnetic waves) from the outside. In this embodiment, the semiconductor device 200 is of the passive type that receives electromagnetic waves from the reader/writer 210 and operates by being supplied with power of the electromagnetic waves; however, the present invention is not limited to this. That is, the semiconductor device 200 may be of the active type or the semi-active type.

In addition, there is no particular limitation on the shape of the antenna that can be used in the present invention. Therefore, the antenna circuit 201 included in the semiconductor device 200 may adopt a variety of signal transmission methods such as an electromagnetic coupling method, an electromagnetic induction method, or a radio wave method. The transmission method may be selected as appropriate by a practitioner in consideration of the application of the semiconductor device, and an antenna having an optimum length and shape may be provided in accordance with the transmission method.

If the electromagnetic coupling method or the electromagnetic induction method (e.g., 13.56 MHz band) is used as the signal transmission method, electromagnetic induction caused by a change in magnetic field density is utilized. Accordingly, a conductive film functioning as an antenna is formed into an annular shape (e.g., a loop antenna) or a spiral shape (e.g., a spiral antenna).

If a microwave method (e.g., the UHF band (860 MHz to 960 MHz band) or the 2.45 GHz band) which is a kind of the radio wave methods is used as the transmission method, the length or shape of the conductive film functioning as an antenna may be determined as appropriate in consideration of the wavelength of radio waves used for signal transmission. For example, the conductive film functioning as an antenna may be formed into a linear shape (e.g., a dipole antenna) or a flat shape (e.g., a patch antenna). The shape of the conductive film functioning as an antenna is not limited to a linear shape, and it may be a curved line, a meander shape, or a combination thereof in consideration of the wavelength of electromagnetic waves.

The memory circuit 203 stores as least data unique to the semiconductor device 200 (individual identification information (ID)). The memory circuit 203 includes a control circuit which writes/reads data in accordance with a signal from the digital circuit 202, and a circuit having a memory element. The memory circuit 203 includes one or more kinds of memories selected from an organic memory, a dynamic random access memory (DRAM), a static random access memory (SRAM), a ferroelectric random access memory (FeRAM), a mask read-only memory (ROM), a programmable read only memory (PROM), an electrically programmable read only memory (EPROM), an electrically erasable programmable read only memory (EEPROM), and a flash memory. If the content of stored data is data unique to the semiconductor device 200 (such as individual identification info, illation (ID)), a nonvolatile memory that can hold the data without power supply can be used. If the data is temporarily stored when the semiconductor device 200 performs a process, a volatile memory may be used. Particularly in the case where the semiconductor device 200 includes no battery, i.e., is of a so-called passive type, a nonvolatile memory can be used. Furthermore, a non-rewritable memory can be used to store data unique to the semiconductor device 200 in consideration of security.

This embodiment can be implemented in appropriate combination with the other embodiments described in this specification.

Embodiment 2

In this embodiment, description will be made on an example of a semiconductor device which has a configuration to detect whether a writing voltage to the memory circuit 203 is within the specifications of the semiconductor device (a voltage within a predetermined range) or is out of the specifications (a voltage out of the predetermined range).

Figure 2:
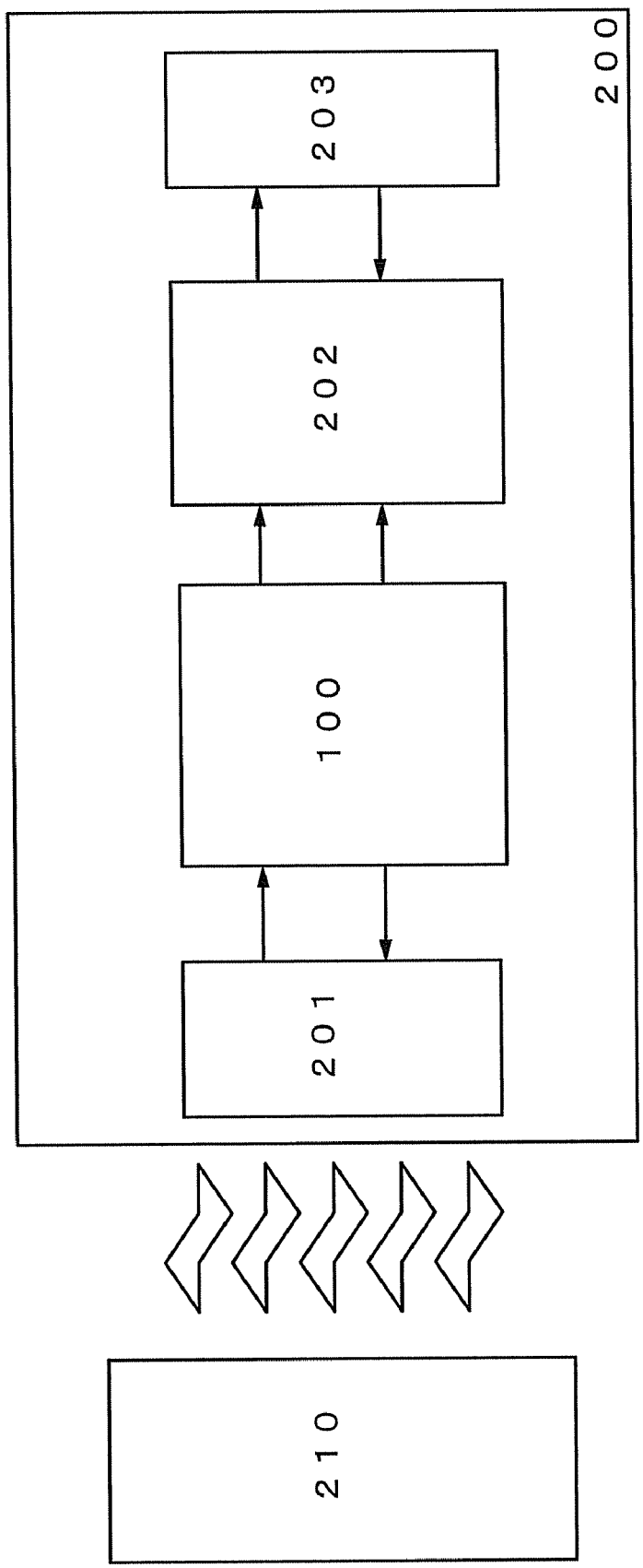
FIG. 2 is a diagram illustrating a semiconductor device.

In FIG. 2, when a writing voltage within the specifications of the semiconductor device is input to the memory circuit 203, writing operation to the memory circuit 203 can be performed normally. However, a writing voltage out of the specifications is obtained in some cases, such as when communication is performed with a long distance between the reader/writer 210 and the semiconductor device 200, or when a defective portion exists in the semiconductor device 200. In such a case, the memory circuit 203 cannot operate normally, and it is difficult that writing operation to the memory circuit 203 is performed normally.

In the semiconductor device of this embodiment, the analog circuit 100 has a function of detecting whether a writing voltage to the memory circuit 203 is within the specifications of the semiconductor device. In the case where a writing voltage within the specifications is obtained, writing operation to the memory circuit 203 is performed.

Figure 3:
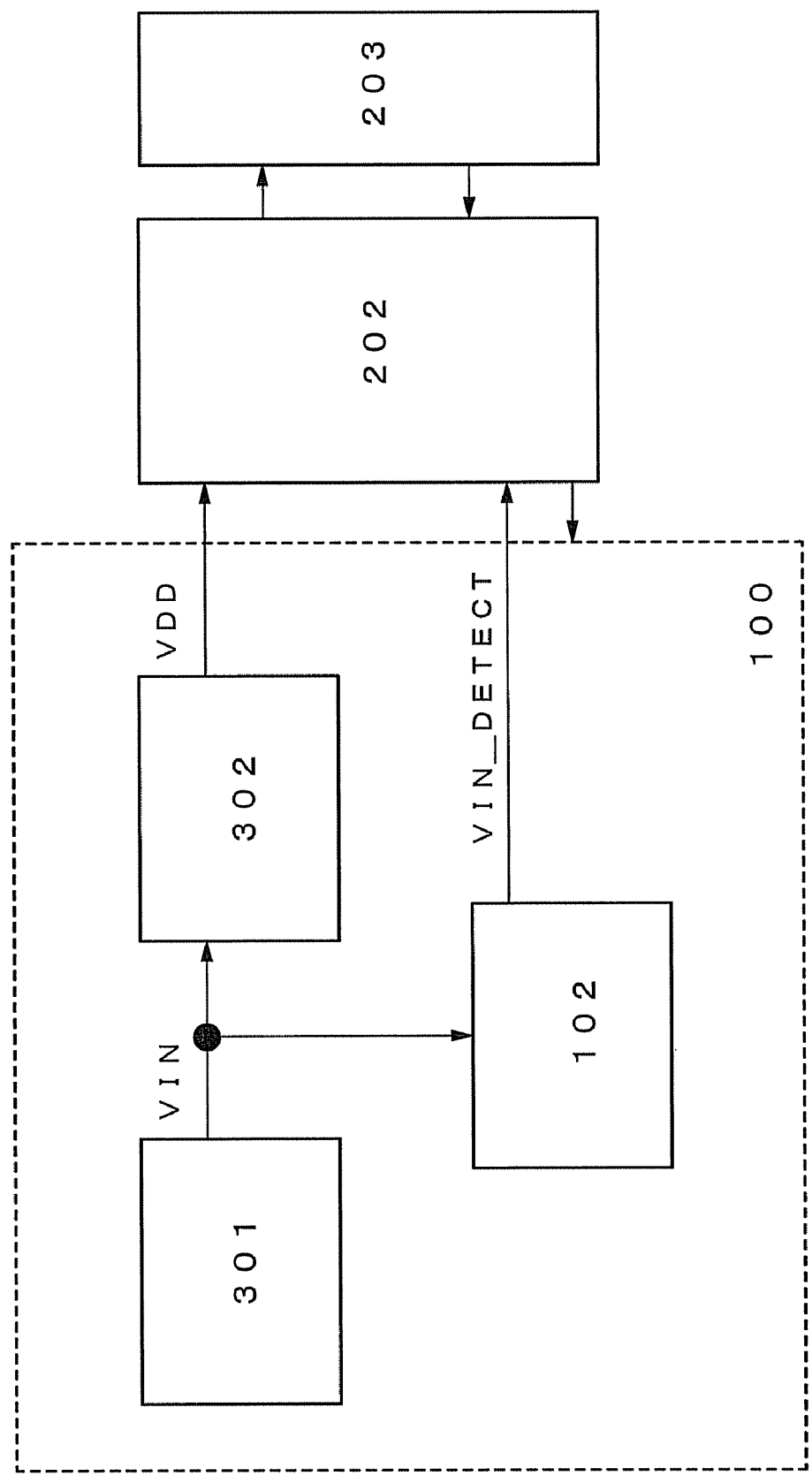
FIG. 3 is a diagram illustrating a semiconductor device.

FIG. 3 illustrates a configuration of the analog circuit 100. The analog circuit 100 includes a rectifier circuit 301, the detecting circuit 102, and a constant voltage circuit 302. The detecting circuit 102 has a function of detecting whether a writing voltage to the memory circuit 203 is within the specifications of the semiconductor device and judging whether writing operation to the memory circuit 203 is performed.

Operation of the circuit illustrated in FIG. 3 will be described below.

First, an AC signal generated by the antenna circuit 201 is input to the rectifier circuit 301. The rectifier circuit 301 rectifies and smoothes the input voltage to generate a signal voltage (VIN) (the name of the voltage is not limited to VIN), and transmits the generated signal to the detecting circuit 102, the constant voltage circuit 302, and the memory circuit 203. Note that the rectifier circuit 301 may only rectify the input voltage. The constant voltage circuit 302 generates a power supply voltage in accordance with the signal voltage (VIN). A writing voltage based on the signal voltage (VIN) is input to the memory circuit 203. The writing voltage may be a voltage obtained by stepping up the signal voltage (VIN) by a step-up circuit.

The rectifier circuit 301 includes a diode, a capacitor, and the like. The constant voltage circuit 302 is a regulator and the like. The rectifier circuit 301 and the constant voltage circuit 302 may employ any known circuit configuration.

The detecting circuit 102 includes a comparator circuit and the like, and monitors a signal voltage (VIN). If the signal voltage (VIN) is found to be within the specifications of the semiconductor device as the result of monitoring, a HIGH (1) signal is output as a signal VIN_DETECT (the name of the signal is not limited to VIN_DETECT). On the other hand, if the signal voltage (VIN) is found to be out of the specifications of the semiconductor device, a LOW (0) signal is output as VIN_DETECT.

The output signal (VIN_DETECT) from the detecting circuit 102 is input to the selection circuit (the switch circuit) in the digital circuit 202. The digital circuit 202 controls the selection circuit (the switch circuit) in accordance with the output signal (VIN_DETECT).

In the case where the output signal (VIN_DETECT) is HIGH (1), the digital circuit 202 supplies a writing voltage to the memory circuit 203 via the selection circuit (the switch circuit), so that writing operation to the memory circuit 203 is performed. On the other hand, in the case where the output signal (VIN_DETECT) is LOW (0), the selection circuit (the switch circuit) is controlled so that no writing voltage is supplied to the memory circuit 203, thereby stopping the writing operation. That is, the circuit operation can be stopped if the signal voltage (VIN) is out of the specifications of the semiconductor device.

As set forth above, by detecting the signal voltage (VIN) by the detecting circuit 102, the writing operation can be stopped in the case where the signal voltage (VIN) is out of the specifications of the semiconductor device. Thus, the reliability of writing operation can be improved.

Furthermore, when the writing operation is stopped in the case where the signal voltage (VIN) is out of the specifications of the semiconductor device, a writing voltage is not supplied to the memory circuit 203, resulting in reduction in power consumption.

Note that a signal LOW (0) may be output as the output signal VIN_DETECT when the signal voltage (VIN) is within the specifications, and a signal HIGH (1) may be output as the output signal VIN_DETECT when the signal voltage (VIN) is out of the specifications.

This embodiment can be implemented in appropriate combination with the other embodiments described in this specification.

Embodiment 3

In this embodiment, description will be made on an example of a semiconductor device which has a configuration to detect whether a power supply voltage is within the specifications of the semiconductor device (a voltage within a predetermined range) or is out of the specifications (a voltage out of the predetermined range).

In FIG. 2, the memory circuit 203 can operate normally in the case where a power supply voltage generated by the analog circuit 100 is within the specifications of the semiconductor device. However, a power supply voltage out of the specifications is obtained in some cases, such as when communication is performed with a long distance between the reader/writer 210 and the semiconductor device 200, or when a defective portion exists in the semiconductor device 200. In such a case, a desired power supply voltage is not supplied to the memory circuit 203, and it is difficult that the memory circuit 203 operates normally.

Note that the power supply voltage is supplied not only to the memory circuit 203, and may be supplied as a power supply to each circuit if other circuits are included.

In the semiconductor device of this embodiment, the analog circuit 100 has a function of detecting whether a power supply voltage is within the specifications of the semiconductor device. In the case where a power supply voltage within the specifications is obtained, a power supply is supplied to the memory circuit 203.

Figure 4:
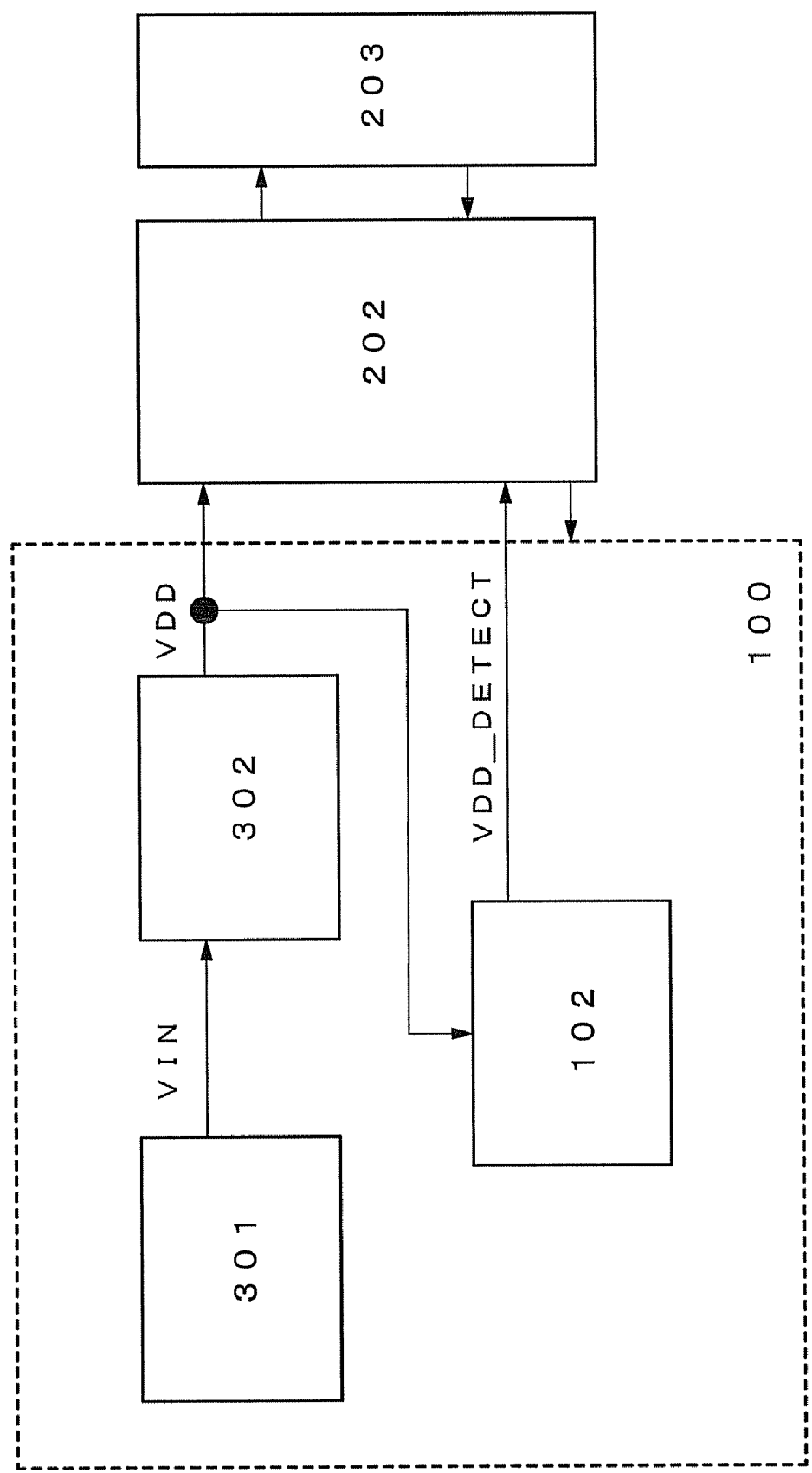
FIG. 4 is a diagram illustrating a semiconductor device.

FIG. 4 illustrates a configuration of the analog circuit 100 having a function of detecting a power supply voltage. The analog circuit 100 includes the rectifier circuit 301, the constant voltage circuit 302, and the detecting circuit 102, which is similar to that of Embodiment 2 except the position in which the detecting circuit 102 is provided. The detecting circuit 102 has a function of detecting whether a power supply voltage is within or out of the specifications of the semiconductor device, and judging whether a power supply is supplied to the memory circuit 203 or not.

Operation of the circuit illustrated in FIG. 4 will be described below.

The constant voltage circuit 302 generates a power supply voltage (VDD) in accordance with a signal voltage (VIN) from the rectifier circuit 301 (the names of the voltages are not limited to VIN and VDD), and outputs the power supply voltage to the detecting circuit 102. The detecting circuit 102 monitors the power supply voltage (VDD), and outputs a HIGH (1) signal as a signal VDD_DETECT (the name of the signal is not limited to VDD_DETECT) if the power supply voltage is within the specifications of the semiconductor device. On the other hand, if the power supply voltage (VDD) is out of the specifications of the semiconductor device, a LOW (0) signal is output as VDD_DETECT.

The output signal (VDD_DETECT) from the detecting circuit 102 is input to the selection circuit (the switch circuit) in the digital circuit 202. The digital circuit 202 controls the selection circuit (the switch circuit) in accordance with the output signal (VDD_DETECT).

In the case where the output signal (VDD_DETECT) is HIGH (1), the digital circuit 202 supplies a writing voltage to the memory circuit 203 via the selection circuit (the switch circuit), so that writing operation to the memory circuit 203 is performed. On the other hand, in the case where the output signal (VDD_DETECT) is LOW (0), the selection circuit (the switch circuit) is controlled to stop the writing operation. That is, the circuit operation can be stopped if the power supply voltage (VDD) is out of the specifications of the semiconductor device.

As set forth above, by detecting the power supply voltage (VDD) by the detecting circuit 102, the operation of the semiconductor device 200 can be stopped in the case where the power supply voltage (VDD) is out of the specifications of the semiconductor device. Thus, the reliability of semiconductor device 200 can be improved.

In addition, the circuit operation is stopped in the case where the power supply voltage (VDD) is out of the specifications, which results in reduction in power consumption.

Note that a signal LOW (0) may be output as the output signal VDD_DETECT when the power supply voltage (VDD) is within the specifications, and a signal HIGH (1) may be output as the output signal VDD_DETECT when the power supply voltage (VDD) is out of the specifications.

This embodiment can be implemented in appropriate combination with the other embodiments described in this specification.

Embodiment 4

The circuit for detecting a signal voltage (VIN) and the circuit for detecting a power supply voltage (VDD) are described in Embodiments 2 and 3, respectively. However, a semiconductor device to which the present invention can be applied is not limited to such a circuit configuration.

The semiconductor device of the present invention may have a configuration including both the circuit for detecting a signal voltage (VIN) and the circuit for detecting a power supply voltage (VDD), or may have a configuration in which a signal voltage (VIN) and a power supply voltage (VDD) are detected by one circuit.

The analog circuit 100 may have a circuit portion such as a limiter circuit, a demodulation circuit, or a modulation circuit in addition to the rectifier circuit 301 and the constant voltage circuit 302. An output voltage from these circuits may be detected by the detecting circuit.

This embodiment can be implemented in appropriate combination with the other embodiments described in this specification.

Embodiment 5

In this embodiment, an example of a configuration of the detecting circuits described in Embodiments 1 to 4 will be specifically described. The circuit configuration is not limited to that shown in this embodiment, and other configurations having a similar function may be used as appropriate.

Figure 5:
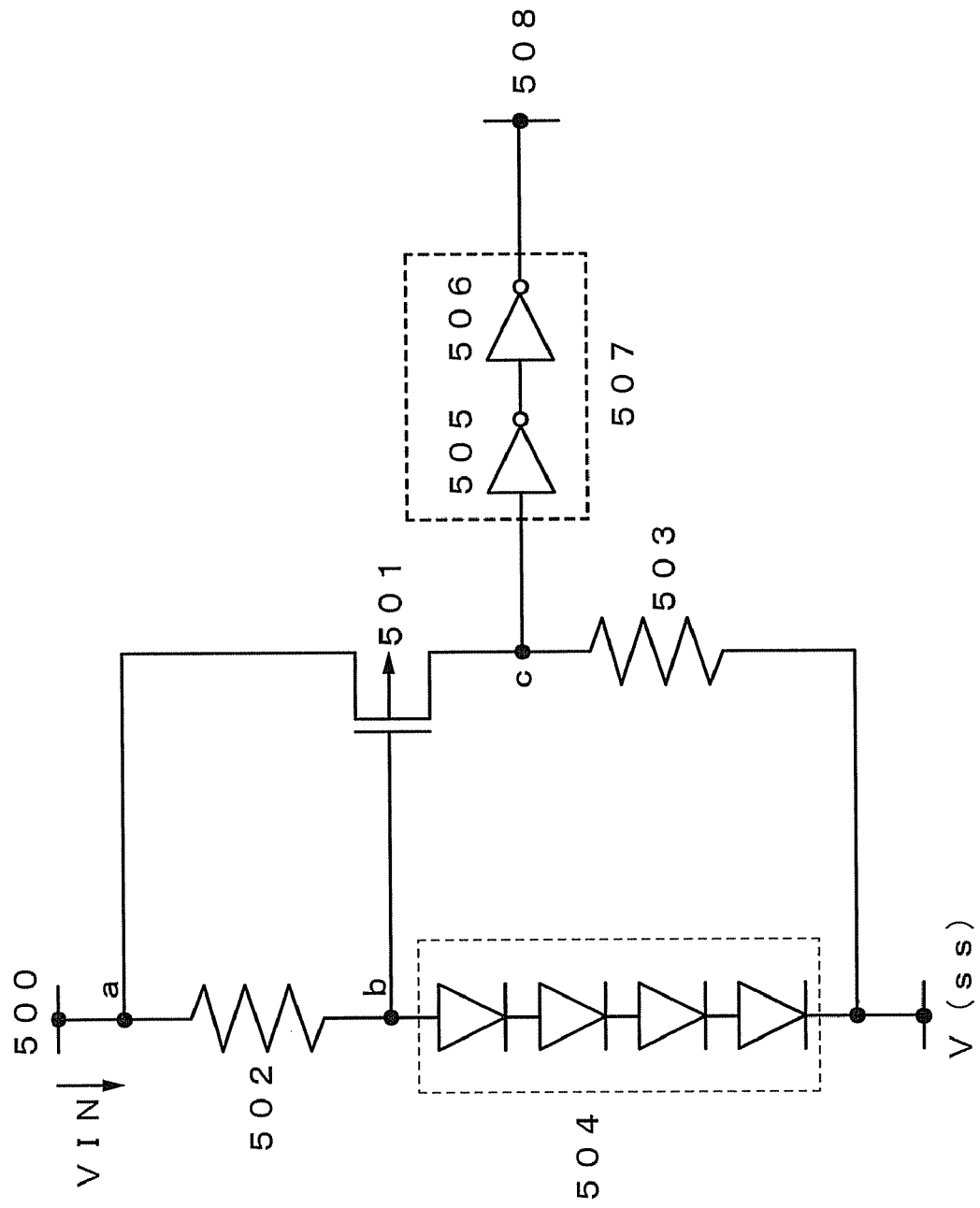
FIG. 5 is a diagram illustrating a semiconductor device.

FIG. 5 illustrates a specific configuration of a detecting circuit, which includes an input portion 500, a P-type transistor (also referred to as a transistor portion) 501, a first resistor 502, a second resistor 503, a diode portion 504, a buffer circuit 507 having a first inverter 505 and a second inverter 506, and an output portion 508.

The input portion 500 is connected to the rectifier circuit 301 in FIG. 3 and to the constant voltage circuit 302 in FIG. 4.

The output portion 508 is connected to the digital circuit 202 in FIG. 3 and FIG. 4.

The diode portion 504 may include one or plural diodes. In the case where a plurality of diodes are included in the diode portion 504, they are preferably connected in series so that a current flows in one direction. That is, one terminal of the diode portion 504 is an anode and the other terminal is a cathode. Note that the number of diodes may be determined in accordance with a specified voltage of the semiconductor device 200.

The input portion 500, which is a wiring to which a signal voltage (VIN) is input, is electrically connected to one terminal of the first resistor 502 and a source of the P-type transistor 501. The other terminal of the first resistor 502 is electrically connected to the anode of the diode portion 504 and a gate of the P-type transistor 501. The cathode of the diode portion 504 is electrically connected to a wiring that is at a reference potential (Vss) and one terminal of the second resistor 503. An input terminal of the first inverter 505 is electrically connected to a drain of the P-type transistor 501 and the other terminal of the second resistor 503. An input terminal of the second inverter 506 is electrically connected to an output terminal of the first inverter 505 and an output terminal of the second inverter 506 is electrically connected to the output portion 508. Note that the reference potential (Vss) may be any potential lower than the potential of the input portion, and may be a ground potential. In the case where the reference potential (Vss) is a ground potential, another ground potential in the semiconductor device 200 may be supplied.

In the diode portion 504, a PN diode, a PIN diode, a Schottky diode, a diode-connected N-type transistor, or a diode-connected P-type transistor may be used.

Figure 6:
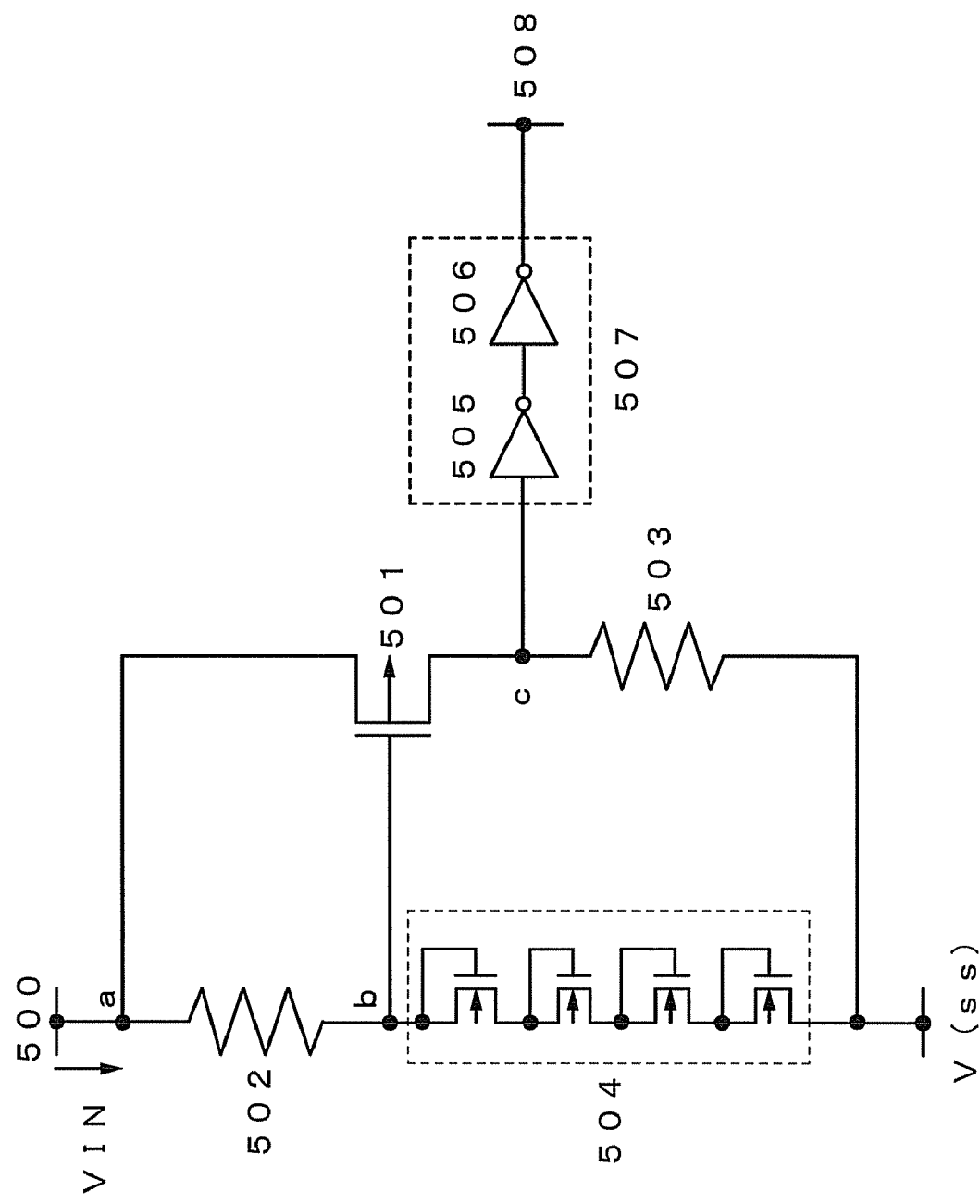
FIG. 6 is a diagram illustrating a semiconductor device.
Figure 7:
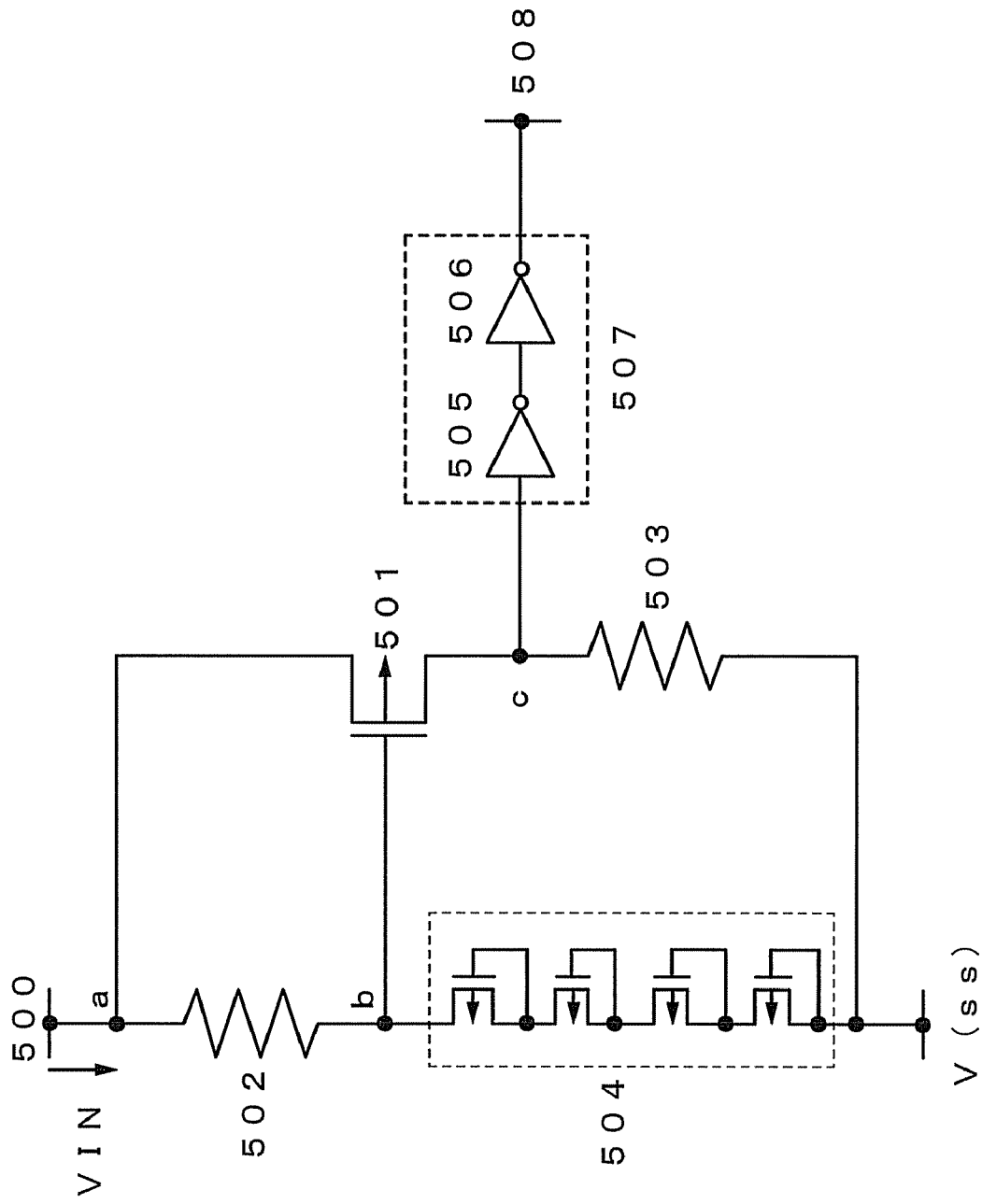
FIG. 7 is a diagram illustrating a semiconductor device.

FIG. 6 illustrates an example in which diode-connected N-type transistors are used in the diode portion 504 of FIG. 5, and FIG. 7 illustrates an example in which diode-connected P-type transistors are used in the diode portion 504 of FIG. 5. The circuits illustrated in FIGS. 5 to 7 operate in a similar manner.

The operation principle of the circuit in the case where a signal voltage (VIN) is input will be described with reference to FIG. 5.

First, a signal voltage (VIN) is input from the input portion 500. If the potential difference between the two terminals of the diode portion 504 is equal to or more than the value of the voltage drop of the diode portion 504, a current flows through the diode portion 504 and also through the first resistor 502. Thus, the potential at a node b is lower than the potential at a node a. When the potential difference between the node a and the node b, that is, the potential difference between the gate and the source (Vgs) of the P-type transistor 501 is equal to or more than the threshold voltage of the P-type transistor 501, the P-type transistor 501 is turned on and a current flows; thus, the potential at the node c becomes VIN. Accordingly, a HIGH (1) signal is output as a signal (VIN_DETECT) from the output portion 508 via the buffer circuit 507.

On the other hand, if the signal voltage (VIN) is so small that the potential difference between the two terminals of the diode portion 504 is less than the value of the voltage drop of the diode portion 504, almost no current flows through the diode portion 504, and thus the potential difference between the node a and the node b is less than the threshold voltage of the P-type transistor 501. Accordingly, the P-type transistor 501 is turned off and no current flows to the node c; thus, the node c is always at the reference potential (Vss). Therefore, a LOW (0) signal is output as the signal (VIN_DETECT) from the output portion 508 via the buffer circuit 507.

The first resistor 502 is provided in order that the voltage drop from the node a to the node b occurs. The second resistor 503 is provided in order that the voltage drop from the node c to the reference potential occurs. Note that the first resistor and the second resistor are not limited to the resistor elements, and may be other elements having a potential difference between both terminals.

The operation of the detecting circuit described above makes it possible to judge whether the signal voltage (VIN) is within or out of the specifications of the semiconductor device.

The circuit having a similar function makes it also possible to judge whether the power supply voltage (VDD) is within or out of the specifications of the semiconductor device.

This embodiment can be implemented in appropriate combination with the other embodiments described in this specification.

Embodiment 6

This embodiment shows an example of the detecting circuits described in Embodiments 1 to 5, a circuit configuration of which is changed in accordance with a specified voltage.

Figure 8:
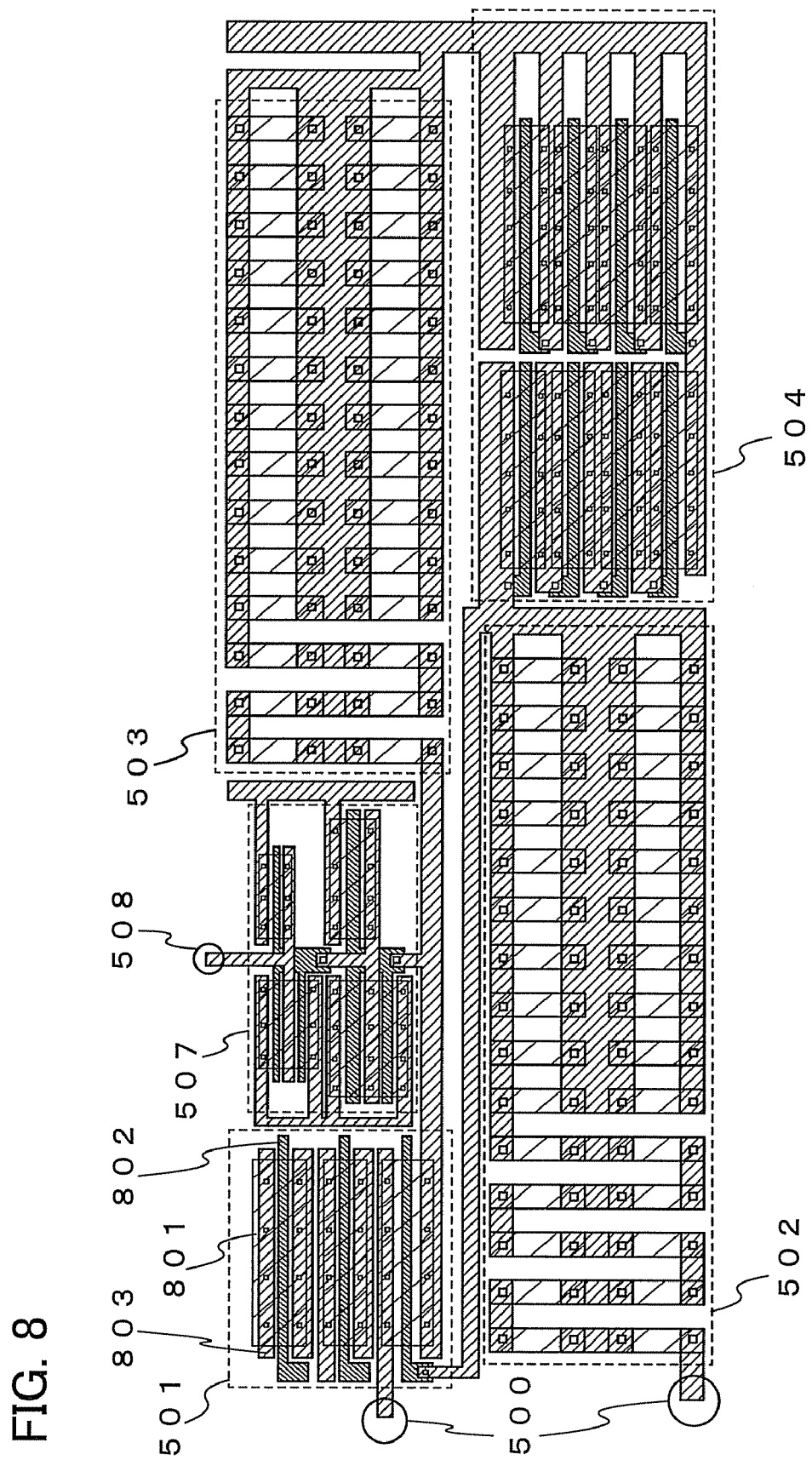
FIG. 8 is a diagram illustrating a semiconductor device.

FIG. 8 is a layout of the circuit illustrated in FIG. 6. FIG. 8 illustrates a circuit including the input portion 500, the P-type transistor 501, the first resistor 502, the second resistor 503, the diode portion 504 having diode-connected N-type transistors, the buffer circuit 507, and the output portion 508. The reference numerals in FIG. 8 correspond to those in FIG. 6. Here, the diode portion 504 may have diode-connected P-type transistors as illustrated in FIG. 7.

In FIG. 8, a semiconductor layer 801, a first conductive layer 802 serving as a gate wiring, and a second conductive layer 803 serving as a source wiring and a drain wiring (including other wirings formed using the same layer as the source wiring and the drain wiring) are illustrated and other insulating layers, wirings, and the like are omitted for simplicity.

The semiconductor layer 801 can be made of a semiconductor such as silicon or germanium, an oxide semiconductor such as ZnO or InGaZnO, an organic semiconductor, or the like. For the semiconductor layer 801, an amorphous semiconductor, a crystalline semiconductor, a single crystal semiconductor, a microcrystalline semiconductor, or the like can be used, and an element imparting conductivity may be added to such a semiconductor. As the element, phosphorus, arsenic, or the like may be used to impart N-type conductivity, and boron, aluminum, or the like may be used to impart P-type conductivity.

The first conductive layer 802 can be made of tungsten, tantalum, titanium, aluminum, a nitride of such an element, a combination thereof, or the like.

The second conductive layer 803 is made of aluminum or an aluminum alloy. In addition, a metal film of molybdenum, chromium, titanium, or the like may be formed as a barrier metal on the upper layer and lower layer of the second conductive layer 803.

As the transistor, a MOS transistor, a thin film transistor, or the like can be used. There is no particular limitation on the structure of the thin film transistor, and a top gate structure, a bottom gate structure, or the like can be used.

Figure 9:
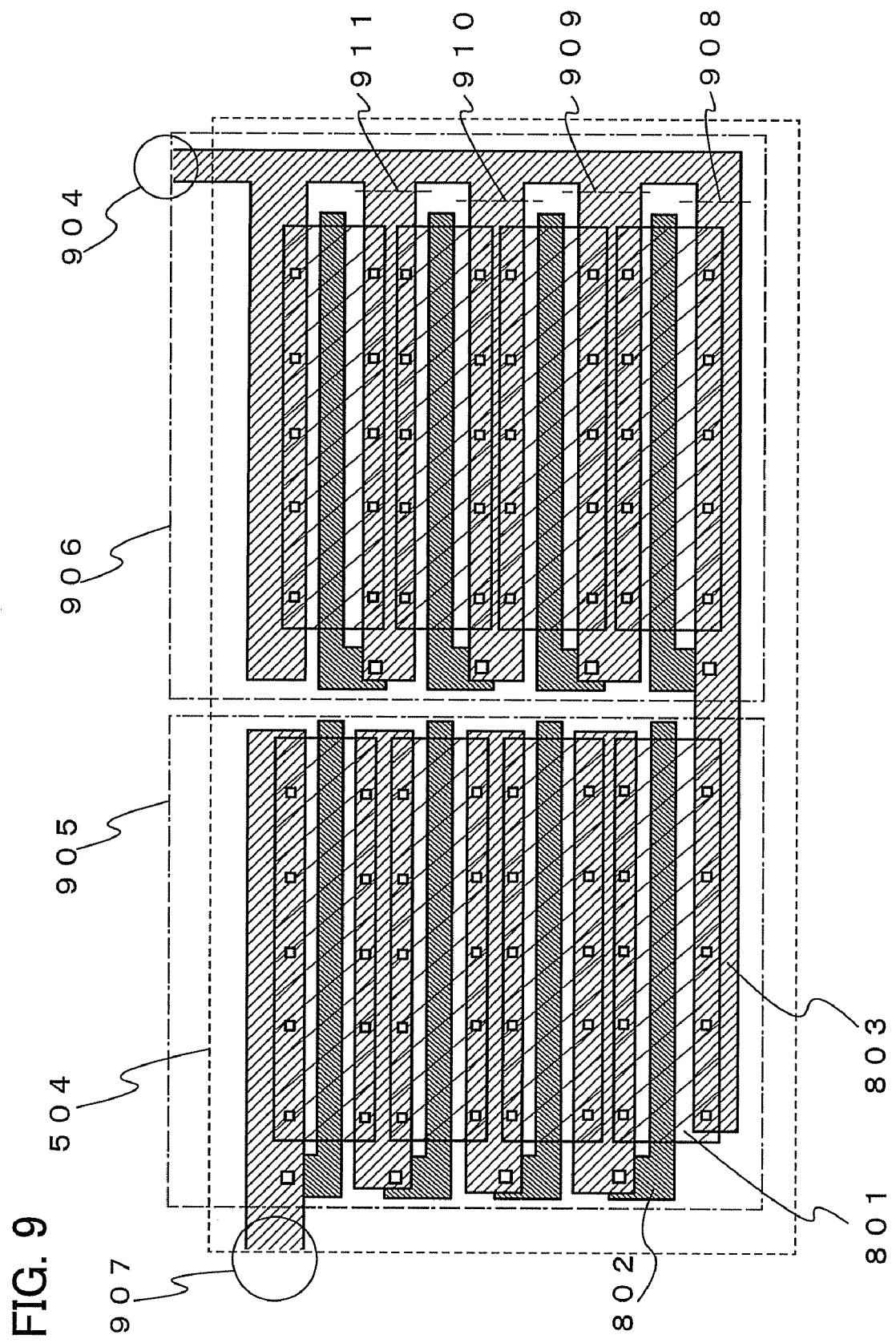
FIG. 9 is a diagram illustrating a semiconductor device.
Figure 11A:
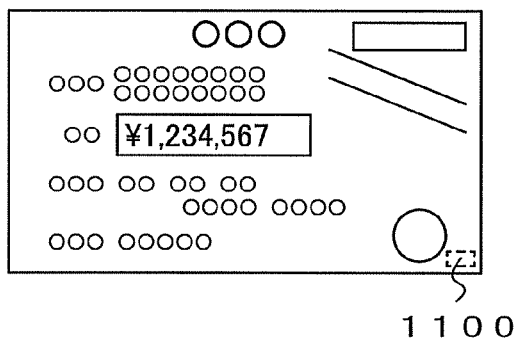
FIGS. 11A to 11G are views illustrating application examples of a semiconductor device.
Figure 11B:
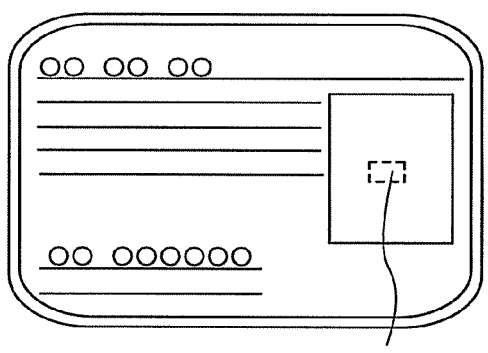
Figure 11C:
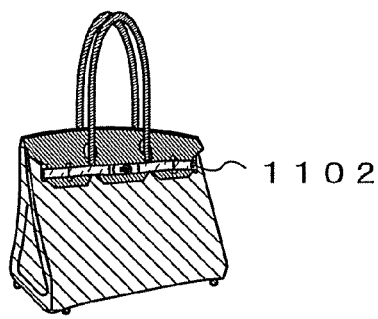
Figure 11D:
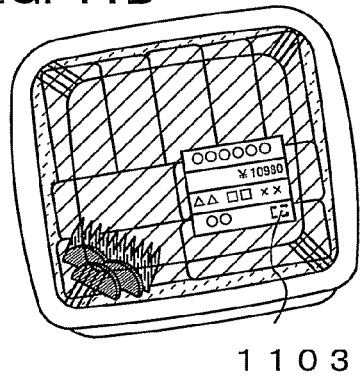
Figure 11E:
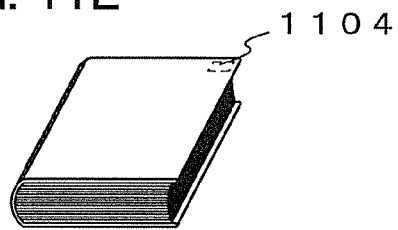
Figure 11F:
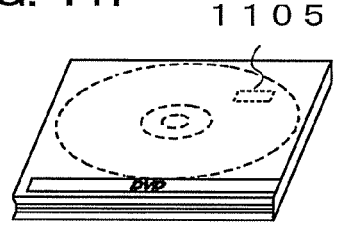
Figure 11G:
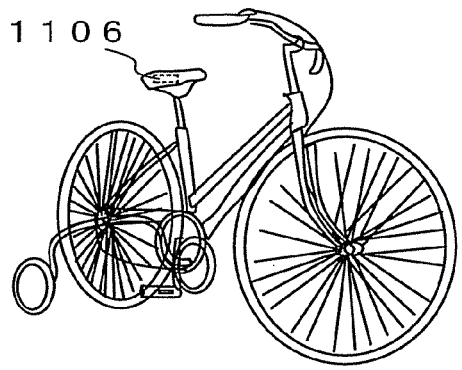

FIG. 9 is an enlarged view of the diode portion 504 in FIG. 8. The diode portion 504 includes a dashed line portion 905 and a dashed line portion 906. An input portion 907 is electrically connected to the node b and a signal voltage (VIN) is input to the input portion 907. A reference voltage is input to an input portion 904.

In the dashed line portion 905, four diode-connected N-type transistors are connected in series. The number of transistors is not limited to four.

The dashed line portion 906 includes four N-type transistors similarly to the dashed line portion 905; however, all the wirings in the dashed line portion 906 are at a reference potential. When a signal voltage (VIN) is input in that state, the voltage drop between the input portion 907 and the input portion 904 occurs in the circuit in the dashed line portion 905.

At this time, a connection portion of a wiring in a dashed line portion 908 is electrically disconnected, whereby five diode-connected transistors are connected in series. When a signal voltage (VIN) is input in that state, the voltage drop between the input portion 907 and the input portion 904 increases as compared to the case in which the four transistors are connected.

Similarly, connection portions of wirings in dashed line portions 909 to 911 are disconnected as appropriate, so that the value of the voltage drop between the input portion 907 and the input portion 904 can be changed.

As the voltage drop between the input portion 907 and the input portion 904 increases, a smaller amount of current flows between the input portion 907 and the input portion 904. Therefore, a larger signal voltage (VIN) needs to be input in order that a HIGH (1) signal is output as the signal (VIN_DETECT) (the circuit operation is performed). That is, the detecting range is changed to detect more strictly.

The wirings can be electrically disconnected by laser light irradiation, which may be performed during or after the manufacturing process of the semiconductor device. Regardless of the kind of a substrate used, such as a glass substrate or a plastic substrate, electrical disconnection can be performed with high accuracy by adjusting the focal point of laser light. Electrical disconnection may be achieved by etching or the like if during the manufacturing process. Alternatively, a switch element may be provided between wirings so that the wirings are electrically disconnected.

Furthermore, the number of diodes serially connected can be reduced when a wiring formed using the first conductive layer 802 or the second conductive layer 803 in the dashed line portion 905 is connected to a wiring at a reference potential. The wirings may be electrically connected to each other with a conductive layer which is additionally provided.

As set forth above, the detecting range of a detecting circuit can be changed by employing a layout in which the number of diodes is variable. In other words, it is possible to manufacture a detecting circuit, the detecting range of which can be changed in accordance with a specified voltage of the semiconductor device.

This embodiment can be implemented in appropriate combination with the other embodiments described in this specification.

Embodiment 7

This embodiment shows an example of the detecting circuits described in Embodiments 1 to 5, a circuit configuration of which is changed in accordance with a specified voltage.

FIG. 10 is an enlarged view of the P-type transistor 501 (the transistor portion) in the layout of the detecting circuit illustrated in FIG. 8.

In FIG. 10, a dashed line portion 1001 is a portion in which a P-type transistor is electrically connected to the circuit through wirings formed using the first conductive layer 802 and the second conductive layer 803.

In a dashed line portion 1002, two P-type transistors are in an electrically floating state.

If the P-type transistor in the dashed line portion 1001 has a small current supply capability, it is connected in parallel to the P-type transistor in the dashed line portion 1002. When the P-type transistors are connected in parallel to each other, the channel width (the length in the direction perpendicular to the moving direction of carriers in a channel formation region) can be made larger, which results in an increase in the current supply capability of the transistor.

The P-type transistors can be connected in parallel to each other with a conductive layer which is additionally provided.

On the other hand, in the case of employing a layout in which three P-type transistors are connected in parallel, the number of transistors can be reduced by electrically disconnecting a wiring. Electrical disconnection of the wiring can be achieved by the method shown in Embodiment 6.

As set forth above, the detecting range of a detecting circuit can be changed by employing a layout in which the channel width of transistors is variable. In other words, it is possible to manufacture a detecting circuit, the detecting range of which can be changed in accordance with a specified voltage of the semiconductor device.

Furthermore, the first resistor 502 or the second resistor 503 in FIG. 8 may employ the structure shown in this embodiment or Embodiment 6, so that the resistance value can be changed. The detecting range of a detecting circuit can be changed also by changing the resistance of the first resistor 502 or the second resistor 503.

This embodiment can be implemented in appropriate combination with the other embodiments described in this specification.

Embodiment 8

In this embodiment, application examples of the semiconductor device will be described.

The application range of the semiconductor device is so wide and can be applied to any product in order that the information on the product such as the history thereof is recognized in a non-contact manner and utilized in production, management, and the like. For example, the semiconductor device can be incorporated in bills, coins, securities, certificates, bearer bonds, packaging containers, books, recording media, personal belongings, vehicles, groceries, garments, health products, household goods, medicines, and electronic apparatuses. Examples of such products will be described with reference to FIGS. 11A to 11G.

Bills and coins are money that circulates in the market, and include one that can be used in the same way as money in a specific area (cash voucher), a commemorative coin, and the like. The securities refer to checks, certificates, promissory notes, and the like (see FIG. 11A). The certificates refer to driver's licenses, certificates of residence, and the like (see FIG. 11B). The personal belongings refer to bags, a pair of glasses, and the like (see FIG. 11C). Bearer bonds refer to stamps, rice coupons, various merchandise coupons, and the like. The packaging containers refer to wrapping paper for a lunch box or the like, plastic bottles, and the like (see FIG. 11D). The books refer to hardbacks, paperbacks, and the like (see FIG. 11E). The recording media refer to DVD software, video tapes, and the like (see FIG. 11F). The vehicles refer to wheeled vehicles such as bicycles, ships, and the like (see FIG. 11G).

The products illustrated in FIGS. 11A to 11G can be provided with semiconductor devices 1100 to 1106, respectively, which performs wireless communication.

The groceries refer to foods, beverages, and the like. The garments refer to clothes, shoes, and the like. The health products refer to medical apparatuses, health appliances, and the like. The household goods refer to furniture, lighting apparatuses, and the like. The medicines refer to drugs, agricultural chemicals, and the like. The electronic appliances refer to liquid crystal display devices, EL display devices, television sets (television receivers, thin television receivers), cellular phones, and the like. Such products may be provided with the semiconductor device disclosed in this specification.

Such a semiconductor device can be provided by being attached to the surface of a product or being embedded in a product. For example, in the case of a book, the semiconductor device may be embedded in the paper; and in the case of a package made of an organic resin, the semiconductor device may be embedded in the organic resin.

By thus providing a semiconductor device in the packaging containers, the recording media, the personal belongings, the groceries, the garments, the household goods, the electronic appliances, and the like, the efficiency of an inspection system, a system used in a rental shop, or the like can be improved. In addition, by providing a semiconductor device in the vehicles, forgery or theft can be prevented. Moreover, when a semiconductor device is implanted into creatures such as animals, each creature can be identified easily. For example, by implanting or attaching a semiconductor device with a sensor in or to a creature such as livestock, its health condition such as a current body temperature as well as its year of birth, sex, breed, or the like can be easily managed.

This embodiment can be implemented in appropriate combination with the other embodiments described in this specification.

This application is based on Japanese Patent Application serial No. 2008-251131 filed with Japan Patent Office on Sep. 29, 2008, the entire contents of which are hereby incorporated by reference.

EXPLANATION OF REFERENCE

100: analog circuit, 101: output voltage, 102: detecting circuit, 103 to 108: steps, 200: semiconductor device, 201: antenna circuit, 202: digital circuit, 203: memory circuit, 210: reader/writer, 301: rectifier circuit, 302: constant voltage circuit, 500: input portion, 501: P-type transistor, 502: first resistor, 503: second resistor, 504: diode portion, 505: first inverter, 506: second inverter, 507: buffer circuit, 508: output portion, 801: semiconductor layer, 802: first conductive layer, 803: second conductive layer, 904: input portion, 905: dashed line portion, 906: dashed line portion, 907: input portion, 908: dashed line portion, 909: dashed line portion, 910: dashed line portion, 911: dashed line portion, 1001: dashed line portion, 1002: dashed line portion, 1100: semiconductor device, 1101: semiconductor device, 1102: semiconductor device, 1103: semiconductor device, 1104: semiconductor device, 1105: semiconductor device, and 1106: semiconductor device.

The invention claimed is:

1. A semiconductor device comprising:
   an antenna;
   a memory circuit configured to receive electric power from the antenna;
   a detecting circuit configured to detect a voltage input to the memory circuit; and
   a control circuit configured to control operation of the memory circuit depending on an output signal from the detecting circuit,
   wherein the detecting circuit includes:
      an input terminal;
      an output terminal for outputting the output signal from the detecting circuit;
      a reference voltage terminal;
      a first resistor, wherein one terminal of the first resistor is electrically connected to the input terminal;
      a transistor, wherein one of a source and a drain of the transistor is electrically connected to the input terminal and a gate of the transistor is electrically connected to the other terminal of the first resistor;
      a diode portion having a plurality of diodes serially connected, wherein one terminal of the diode portion is electrically connected to the other terminal of the first resistor and the other terminal of the diode portion is electrically connected to the reference voltage terminal;
      a second resistor, wherein one terminal of the second resistor is electrically connected to the reference voltage terminal and the other terminal of the second resistor is electrically connected to the other of the source and the drain of the transistor; and
      a buffer circuit,
      wherein the other of the source and the drain of the transistor and the other terminal of the second resistor are electrically connected to the output terminal via the buffer circuit.

2. The semiconductor device according to claim 1, wherein the plurality of diodes are diode-connected N-type transistors.

3. The semiconductor device according to claim 1, wherein the plurality of diodes are diode-connected P-type transistors.

4. The semiconductor device according to claim 1,
   wherein the diode portion includes a connection portion in which an anode of one or more of the plurality of diodes is electrically connected to the reference voltage terminal; and wherein the number of diodes serially connected is increased by electrically disconnecting the connection portion.

5. The semiconductor device according to claim 4, wherein electrical disconnection of the connection portion is performed by laser light irradiation.

6. The semiconductor device according to claim 1,
wherein the diode portion includes a disconnection portion in which an anode of one or more of the plurality of diodes is not electrically connected to the reference voltage terminal; and
wherein the number of diodes serially connected is decreased by electrically connecting the disconnection portion.

7. A semiconductor device comprising:
an antenna;
a rectifier circuit configured to rectify a signal from the antenna;
a memory circuit electrically connected to the rectification circuit to be supplied with an output voltage of the rectifier circuit
a detecting circuit configured to detect the output voltage of the rectifiercircuit; and
a control circuit configured to control operation of the memory circuit depending on an output signal from the detecting circuit,
wherein the detecting circuit includes:
an input terminal;
an output terminal for outputting the output signal from the detecting circuit;
a reference voltage terminal;
a first resistor, wherein one terminal of the first resistor is electrically connected to the input terminal;
a transistor, wherein one of a source and a drain of the transistor is electrically connected to the input terminal and a gate of the transistor is electrically connected to the other terminal of the first resistor;
a diode portion having a plurality of diodes serially connected, wherein one terminal of the diode portion is electrically connected to the other terminal of the first resistor and the other terminal of the diode portion is electrically connected to the reference voltage terminal;
a second resistor, wherein one terminal of the second resistor is electrically connected to the reference voltage terminal and the other terminal of the second resistor is electrically connected to the other of the source and the drain of the transistor; and
a buffer circuit,
wherein the other of the source and the drain of the transistor and the other terminal of the second resistor are electrically connected to the output terminal via the buffer circuit.

8. The semiconductor device according to claim 7, wherein the plurality of diodes are diode-connected N-type transistors.

9. The semiconductor device according to claim 7, wherein the plurality of diodes are diode-connected P-type transistors.

10. The semiconductor device according to claim 7,
wherein the diode portion includes a connection portion in which an anode of one or more of the plurality of diodes is electrically connected to the reference voltage terminal; and
wherein the number of diodes serially connected is increased by electrically disconnecting the connection portion.

11. The semiconductor device according to claim 10, wherein electrical disconnection of the connection portion is performed by laser light irradiation.

12. The semiconductor device according to claim 7,
wherein the diode portion includes a disconnection portion in which an anode of one or more of the plurality of diodes is not electrically connected to the reference voltage terminal; and
wherein the number of diodes serially connected is decreased by electrically connecting the disconnection portion.

13. A semiconductor device comprising:
an antenna;
a rectifier circuit configured to rectify a signal from the antenna;
a voltage regulator circuit configured to regulate a voltage from the rectifier circuit;
a memory circuit electrically connected to the voltage regulator circuit to be supplied with an output voltage of the voltage regulator circuit;
a detecting circuit configured to detect the output voltage of the voltage regulator circuit; and
a control circuit configured to control operation of the memory circuit depending on an output signal from the detecting circuit,
wherein the detecting circuit includes:
an input terminal;
an output terminal for outputting the output signal from the detecting circuit;
a reference voltage terminal;
a first resistor, wherein one terminal of the first resistor is electrically connected to the input terminal;
a transistor, wherein one of a source and a drain of the transistor is electrically connected to the input terminal and a gate of the transistor is electrically connected to the other terminal of the first resistor;
a diode portion having a plurality of diodes serially connected, wherein one terminal of the diode portion is electrically connected to the other terminal of the first resistor and the other terminal of the diode portion is electrically connected to the reference voltage terminal;
a second resistor, wherein one terminal of the second resistor is electrically connected to the reference voltage terminal and the other terminal of the second resistor is electrically connected to the other of the source and the drain of the transistor; and
a buffer circuit,
wherein the other of the source and the drain of the transistor and the other terminal of the second resistor are electrically connected to the output terminal via the buffer circuit.

14. The semiconductor device according to claim 13, wherein the plurality of diodes are diode-connected N-type transistors.

15. The semiconductor device according to claim 13, wherein the plurality of diodes are diode-connected P-type transistors.

16. The semiconductor device according to claim 13,
wherein the diode portion includes a connection portion in which an anode of one or more of the plurality of diodes is electrically connected to the reference voltage terminal; and
wherein the number of diodes serially connected is increased by electrically disconnecting the connection portion.

17. The semiconductor device according to claim 16, wherein electrical disconnection of the connection portion is performed by laser light irradiation.

18. The semiconductor device according to claim 13,
wherein the diode portion includes a disconnection portion in which an anode of one or more of the plurality of diodes is not electrically connected to the reference voltage terminal; and
wherein the number of diodes serially connected is decreased by electrically connecting the disconnection portion.

19. A semiconductor device comprising:
an input terminal;
an output terminal;
a reference voltage terminal;
a first resistor, wherein one terminal of the first resistor is electrically connected to the input terminal;
a transistor, wherein one of a source and a drain of the transistor is electrically connected to the input terminal and a gate of the transistor is electrically connected to the other terminal of the first resistor;
a diode portion having a plurality of diodes serially connected, wherein one terminal of the diode portion is electrically connected to the other terminal of the first resistor and the other terminal of the diode portion is electrically connected to the reference voltage terminal;
a second resistor, wherein one terminal of the second resistor is electrically connected to the reference voltage terminal and the other terminal of the second resistor is electrically connected to the other of the source and the drain of the transistor; and
a buffer circuit,
wherein the other of the source and the drain of the transistor and the other terminal of the second resistor are electrically connected to the output terminal via the buffer circuit.

20. The semiconductor device according to claim 19, wherein the plurality of diodes are diode-connected N-type transistors.

21. The semiconductor device according to claim 19, wherein the plurality of diodes are diode-connected P-type transistors.

22. The semiconductor device according to claim 19,
wherein the diode portion includes a connection portion in which an anode of one or more of the plurality of diodes is electrically connected to the reference voltage terminal; and
wherein the number of diodes serially connected is increased by electrically disconnecting the connection portion.

23. The semiconductor device according to claim 22, wherein electrical disconnection of the connection portion is performed by laser light irradiation.

24. The semiconductor device according to claim 19,
wherein the diode portion includes a disconnection portion in which an anode of one or more of the plurality of diodes is not electrically connected to the reference voltage terminal; and
wherein the number of diodes serially connected is decreased by electrically connecting the disconnection portion.

* * * * *